United States Patent [19]

Fryd et al.

[11] Patent Number: 4,753,865
[45] Date of Patent: Jun. 28, 1988

[54] PHOTOSENSITIVE COMPOSITIONS CONTAINING MICROGELS

[75] Inventors: Michael Fryd, Haddonfield, N.J.; Terry R. Suess, Towanda, Pa.

[73] Assignee: E. I. Du Pont de Nemours and Company, Wilmington, Del.

[21] Appl. No.: 821,330

[22] Filed: Jan. 22, 1986

[51] Int. Cl.$^4$ .............................. G03C 1/68
[52] U.S. Cl. .................... 430/281; 430/905; 430/906; 430/910; 522/109; 522/112; 522/114; 522/110
[58] Field of Search ............ 522/112, 114, 110, 109; 430/281, 905, 906, 910

[56] References Cited

U.S. PATENT DOCUMENTS

| | | | |
|---|---|---|---|
| 3,615,448 | 10/1971 | Yeshin | 96/35.1 |
| 3,895,082 | 7/1975 | Hochberg | 522/120 X |
| 4,125,700 | 11/1978 | Graham | 430/281 X |
| 4,188,223 | 2/1980 | Woodbrey et al. | 430/286 X |
| 4,191,672 | 3/1980 | Salome | 428/402 X |
| 4,277,536 | 7/1981 | Podszun et al. | 428/402 |
| 4,294,739 | 10/1981 | Upson et al. | 430/285 X |
| 4,414,278 | 11/1983 | Cohen et al. | 428/402 |
| 4,518,472 | 5/1985 | Kishida et al. | 525/305 X |
| 4,542,088 | 9/1985 | Kojima et al. | 430/281 X |
| 4,551,415 | 11/1985 | Cohen et al. | 522/112 X |
| 4,601,970 | 7/1986 | Cohen et al. | 430/281 X |

FOREIGN PATENT DOCUMENTS

| | | | |
|---|---|---|---|
| 52-116301 | 9/1977 | Japan | |
| 0065104 | 6/1978 | Japan | 430/275 |
| 82/2556 | 8/1982 | PCT Int'l Appl. | 522/112 |

OTHER PUBLICATIONS

Herman Mark, "Polymers" in vol. 16 of *Kirk-Othmer Encyclopedia of Chemical Technology*, 2nd ed, John Wiley & Sons, Inc, United States of America, 1968, p. 245.

"Microgel" in *Concise Chemical and Technical Dictionary*, fourth ed., H. Bennett, ed., Chemical Publishing Co., Inc., New York, N.Y., 1986, p. 783.

Primary Examiner—Paul R. Michl
Assistant Examiner—Cynthia Hamilton

[57] ABSTRACT

A solid photopolymerizable composition, contains addition polymerizable ethylenically unsaturated monomer, initiating system, polymer binder and a microgel wherein preferably the binder and microgel form substantially a single phase and have a similar glass transition temperature above 25° C. Although less preferred the solid composition can function without the binder. A preferred use is as a photoresist.

16 Claims, No Drawings

PHOTOSENSITIVE COMPOSITIONS CONTAINING MICROGELS

BACKGROUND OF THE INVENTION

The present invention relates to photosensitive compositions which contain an additive component to influence one or more physical and/or chemical properties of the composition. Such properties can include, without limitation, storage stability, photospeed, ability to laminate and adhere to a substrate and ability to laminate over voids in a substrate. The additive can be added in a concentration to replace a portion or all of a component of the photosensitive composition, e.g., replacement of binder.

Photosensitive compositions particularly useful as photoresists are well known in the prior art. Conventionally these compositions are stored in roll form. The composition is adhered to a support film to form a two ply material such as disclosed in U.S. Pat. No. 4,293,635 or more conventionally in a three ply material such as U.S. Pat. No. 3,469,982 with the composition sandwiched between a support film and a cover sheet. The material is unwound from a roll and the cover sheet, if present, is removed from contact with the photosensitive composition prior to use in lamination to a substrate, e.g., in manufacture of printed circuit boards. In storage of the material a potential defect of cold flow exists. An excessive amount of cold flow results in the material becoming unacceptable, e.g., edge fusion occurs which prevents unwinding of a roll without damaging the continuity of the photopolymerizable composition.

Generally storability with minimization of cold flow is imparted by proper selection and formulation of the components of the photopolymerizable material. An exception to a need to formulate storage stability in a composition is disclosed in U.S. Pat. No. 3,867,153. This publication teaches hardening of the edges of the roll such as by exposure to actinic radiation which prevents cold flow with the photopolymerizable composition effectively sealed within the roll.

Use of an additive component to change physical properties in a composition is well known. One example is using beads as a filler in an organic polymer composition which may be optionally polymerizable as disclosed in U.S. Pat. No. 4,414,278. The polymeric beads are discrete, substantially nonswellable and crosslinked with an average diameter in the range of 0.7 to 20 $\mu$m.

In contrast to the use of the highly crosslinked nonswellable beads in a composition are swellable microgels which are a separate and distinct component. Microgel is a term originated in the paint industry and it includes crosslinked spherical polymer molecules of high molecular weight such as of the order of $10^9$ to $10^{10}$ with a particle size of 0.05 to 1 micron in diameter prepared by emulsion polymerization. Crosslinking renders these microgels insoluble but capable of swelling in strong solvent without destroying the crosslinked structure. The preparation and use of such microgels is described, e.g., in British Pat. No. 967,051 and U.S. Pat. No. 3,895,082.

Use of a component described as a microgel in one type of photosensitive composition is disclosed in Japanese patent application No. 52,116301. The composition contains a major ingredient of a methacrylate ester and a microgel, a polymerizable monomer, a photoinitiator and a thermopolymerization inhibitor. The microgel is a rubber type substance obtained by a graft polymerization of a vinyl monomer with a so-called rubber type base material having particle diameter of 0.01 to 10 microns. This photosensitive composition is used for offset printing.

A delustering coating composition which contains fine particles is disclosed in U.S. Pat. No. 4,518,472. The composition is applied to a molded article to provide high abrasion resistance or scratch resistance. Such composition for coating is a liquid which differs from the solid films of the present invention.

SUMMARY OF THE INVENTION

The present invention is directed to a photosensitive composition comprising
(a) addition polymerizable ethylenically unsaturated monomer,
(b) initiating system activated by actinic radiation,
(c) preformed macromolecular polymer binder, and
(d) microgel,
wherein the photosensitive composition is a solid and wherein at least one of the following is present:
(i) the polymer binder and microgel form substantially one phase as viewed by the naked eye, or
(ii) the polymer binder and microgel have glass transition temperatures which do not differ by more than 50° C. with the microgel having a glass transition temperature above 25° C.

Although less preferred it is possible to formulate the photosensitive composition without the polymeric binder.

DETAILED DESCRIPTION OF THE INVENTION

The starting materials for the solid photosensitive composition of the present invention ordinarily present as a film on a flexible backing material are well known in the prior art with the exception of the microgel of the type disclosed herein. The microgel allows a reformulation of the photosensitive composition which can be simply a different concentration of components to obtain comparable physical properties or comparable processing characteristics particularly in a preferred use as a photoresist in making of a printed circuit board. Alternatively the use of microgels in the photosensitive composition can aid to obtain superior photosensitive formulations, e.g., an increase in photospeed, better strippability of the composition from a substrate or improved ability to cover holes in a substrate during processing.

The photosensitive composition will contain the microgel together with one or more addition polymerizable ethylenically unsaturated monomers, and an initiating system activated by actinic radiation and a performed monomolecular polymer binder. It has been found that a microgel can be used to replace all of the binder components for a composition useful as a photoresist. However in one mode a binder or combination of binders is present but in an amount insufficient to obtain all properties necessary in a commercially acceptable resist. Illustratively a suitable composition can be formulated which will not be storage stable without the added microgel component. A microgel can be utilized in a variety of ways to allow reformulation of the photosensitive composition.

For the property of storage stability it can be measured in a short term test since true storage stability (such as the composition formed into a sheet and wound into a roll on a backing sheet) can take a considerable period of time, i.e., the order of months or even a year. The correlation of storage stability and particularly lack of substantial cold flow of the photosensitive composition causing edge fusion with a short term test can be measured herein by creep viscosity test. A storage stable composition will have a creep viscosity of at least 20 megapoise, preferably at least 30 megapoise, and most preferably at least 40 megapoise. Another test for storage stability would be to store the composition in roll form for six (6) months at 25° C. or for one (1) month at 40° C.

The introduction of the microgel can also influence photospeed and higher photospeeds have been obtained with the introduction of the microgel compared to a similar composition without the microgel. Therefore in one of the suitable modes of the present invention the microgel is added to facilitate an increase in photospeed.

It has been discovered that the incorporation of microgels in a solid photosensitive composition as replacement for some or all of a binder provides thixotropic behavior, where under low shear conditions such as experienced in a roll during storage the film has high viscosity, but under high shear conditions such as lamination the photosensitive composition present as a dry film flows easily and conforms well to a substrate copper surface. This property aids in application of the photosensitive composition to a surface. Illustratively for a photoresist laminated to a surface such as a copper panel having predrilled holes, the ability of the composition to be laminated over the holes is essential. Microgels allow formulation of compositions with an enhanced ability to resist rupture. This ability is commonly referred to as tenting, where addition of the microgel can be advantageous.

In compositions with a binder employed, the relationships between the binder and the microgel allows formulations to obtain the beneficial properties of the present invention, e.g., in a photoresist. One manner of defining this combination of components is that the polymer binder and microgel will form a single homogeneous phase. This homogeneous phase can be viewed with the naked eye. However, more preferably the presence of the single phase is present is viewed under a magnification of 10 times and more preferably a magnification of 100 times.

An alternate manner of describing the combination of a preformed macromolecular binder and microgel is through glass transition temperature. Generally the glass transition temperature will not differ by more than 50° C. and more preferably by more than 25° C. Since one purpose of including the microgel in the composition is to increase viscosity, the glass transition temperature should also be above room temperature (25° C.). Often the binder and microgel will be formulated from common monomers which aids compatibility of the two components although formulation in this manner is not necessary.

It is understood that the definition of microgel herein is employed in its conventional definition. Such definition of a microgel excludes a highly crosslinked material such as in U.S. Pat. No. 4,414,278 which discloses beads which are substantially non-swellable. Illustratively a Swelling Test is set forth in this patent on column 4, lines 30 to 45 with a statement that any degree of swelling is undesirable. A representative sample of a microgel used in the present invention floated in a test solution of the patent rather than sank in accordance with polymeric beads of this patent. Accordingly this test is not considered relevant. Since the degree of crosslinking is controlled in manufacture of a microgel, a substantially nonswellable crosslinked polymeric bead (even of proper size) is not a microgel. Generally the microgels will be present in an average particle size range of from 0.1 to 1 microns and more preferably 0.05 to 0.15 microns.

Preferably the microgels of the present invention will swell in at least one of the following solvents: n-heptane, carbon tetrachloride, toluene, methylene chloride, ethyl acetate, acetone, acetonitrile, acetic acid, dimethylsulfoxide, dimethylformamide, formamide, water, aqueous ammonium hydroxide solution containing up to 10% by weight ammonia, aqueous potassium hydroxide solution containing up to 10% by weight potassium hydroxide, methylene chloride-methanol solution containing by weight 92% methylene chloride and 8% methanol, aqueous sodium carbonate solution containing by weight 1% sodium carbonate.

The above list of solvent is not represented as being exhaustive of a solvent which will cause swelling of the microgel. However such list is believed to qualify microgels with a proper degree of crosslinking.

As a test of swellability a 10 gram sample of the material, i.e., the microgel, is added to 100 grams of solvent. The microgel will swell at least 10%, i.e., at least a 10% increase in volume of the microgel will be obtained. The swelling conventionally will be greater, i.e., at least a 50% increase. Swelling increases of at least 100% can also be realized with many of the microgels.

Since microgels for addition to the photosensitive compositions will greatly increase the viscosity of a solvent by swelling through absorption of solvent, an alternate test is through measurement of an increase in viscosity of the solvent. Initially the solution viscosity of the solvent is measured such as using a Brookfield viscometer with a spindle appropriate for the viscosity of the solvent. Ten grams of a material for testing, i.e. the microgel candidate, is introduced into one hundred grams of the test solution. The material for testing and solvent are stirred at room temperature (i.e., approximately 25° C.) for twenty-four hours. At the end of the time period additional test liquid is added to obtain a final weight of 110 grams, i.e., 100 grams solvent and 10 grams of the material for testing. The viscosity is again measured using the Brookfield viscometer and a spindle appropriate for the viscosity of the mixture.

For qualification of a microgel in this procedure, the increase in viscosity of the solvent with the added material will be at least 100 centipoise. Preferably the increase will be 1,000 centipoise and more preferably 3,000 centipoise.

The microgels employed herein differ from introduction of additives in photosensitive compositions of the prior art. Illustratively the microgels differ over materials disclosed in Japanese patent application No. 52,116301 which is believed to employ a principle of rubber toughening through the incorporation of microgels. The mechanism of rubber toughening of plastics is discussed by Seymour Newman and C. B. Bucknall in "Polymer Blends", D. R. Paul, ed., New York 1978, volume 2, pp. 63–127. The presence of small rubber particles dispersed in a matrix of a more brittle polymer promotes crazing in the matrix polymer on impact, delaying the onset of crack formation. The dispersed phase must be incompatible with the matrix polymer to remain as a discrete phase, and the temperature of use must be above the rubber's glass transition temperature in order for it to function as a toughening agent. Both of these requirements are met in the Japanese application No. 52-116301. The microgel materials cited (for example, polybutyl acrylate, polybutadiene, styrene/butadiene copolymer rubber, ethylene/propylene copolymer elastomer, polyisoprene) are referred to as elastomers which by definition have glass transition temperatures below room temperature. The discussion of the particle size of the rubber material indicates that the rubber exists as discrete particles in the finished article.

As previously discussed the filler additives disclosed in U.S. Pat. No. 4,414,278 differ from the microgel disclosed since the fillers are not microgels. The compositions of U.S. Pat. No. 4,518,472 differ from the composition herein since the compositions of the patent are coating liquids while the present formulations are solids with different utility.

The microgels of the present invention are conventionally prepared by emulsion polymerization. The microgels are generally formed from 90 to 99.5% by weight polymer component and 10 to 0.5% by weight crosslinking agent with these materials compatible in formation of a continuous phase system. The polymer components can be varied during polymerization to produce core and shell microgel with different interior and exterior composition. In the case where a polymeric binder is employed the weight ratio of the microgel to binder can vary widely, e.g., from 1:20 to 1:1.

The microgels can be made from a wide variety of starting materials. Conventionally monoethylenically unsaturated monomers are used in preparing the bulk portion of the microgel, whereas the crosslinking agents contain at least two double bonds.

Preferred monomers are methyl methacrylate, ethyl acrylate, methacrylic acid, butyl methacrylate, ethyl methacrylate, glycidyl methacrylate, styrene and allyl methacrylate; while other useful monomers include acrylonitrile, methacrylonitrile, acrylic acid, methacrylic acid and 2-ethyl-hexyl acrylate.

A preferred crosslinking agent is butanediol diacrylate; while others include ethylene glycol dimethacrylate, tetramethylene glycol diacrylate, trimethylol propane triacrylate, tetraethylene glycol dimethacrylate, methylene bisacrylamide, methylene bismethacrylamide, divinyl benzene, vinyl methacrylate, vinyl crotonate, vinyl acrylate, vinyl acetylene, trivinyl benzene, glycerine trimethacrylate, pentaerythritol tetramethacrylate, triallyl cyanurate, divinyl acetylene, divinyl ethane, divinyl sulfide, divinyl sulfone, hexatriene, triethylene glycol dimethacrylate, diallyl cyanamide, glycol diacrylate, ethylene glycol divinyl ether, diallylphthalate, divinyl dimethyl silane, glycerol trivinyl ether and the like.

Conventionally one or more monomers and crosslinking agents are dispersed in water with suitable emulsifiers and initiators in manufacture of the microgel. Conventional anionic, cationic or nonionic emulsifiers and water soluble initiators can be employed. Examples of emulsifying agents are sodium lauryl sulfate, lauryl pyridine chloride, polyoxyethylene, polyoxypropylene, colloidal silica, anionic organic phosphates, magnesium montmorillonite, the reaction product of 12 to 13 moles of ethylene oxide with 1 mole of octyl phenol, secondary sodium alkyl sulfates and mixtures thereof. Usually from 0.25 to 4% of emulsifier based on the total weight of reactants is used. Examples of initiators are potassium persulfate, sodium persulfate, ammonium persulfate, tertiary butyl hydroperoxide, hydrogen peroxide, azo bis(isobutyronitrile), azo bis(isobutyroimidine hydro chloride), various redox (reduction-oxidation) systems such as hydrogen peroxide and ferrous sulfate and well-known persulfate-bisulfate combinations. Usually, from 0.05 to 5% by weight of initiator based on the weight of coploymerizable monomers is used.

Microgels suitable for the practice of the present invention can be produced by the technique of emulsion polymerization as described in U.S. Pat. No. 3,895,082 (Also British Pat. No. 967,051 teaches a suitable method). This technique can also be modified be beginning the reaction with one set of monomers and then varying the ratios for the final part of the reaction in order to produce spherical microgels in which the first part of the polymer, i.e., the core is different monomer composition than the outer part of the polymer, i.e., the shell. A wide range of both homopolymer microgels and core shell microgels can be produced with varying polymer composition and crosslinking. For the present invention, it is desired that the glass transition temperature of the shell not differ from the polymer binder by more than 50° C. and that the glass transition temperatures of both are and shall be above 25° C.

The art of emulsion polymerization is well known concerning reaction conditions to produce spherical microgels dispersed in a water phase. Unless the dispersion can be used as made and contain no objectional impurities or byproducts, it is usually necessary to convert the microgels to a dry powder prior to their use in a photosensitive composition. Well-known techniques of coagulation, filtration, washing and drying may be employed for this purpose. Spray drying is a particularly useful method for the present invention. Generally the amount of crosslinking agent in the microgel will be less than 20% by weight of the overall weight of the microgel and generally less than 10% by weight. It is understood that all of the crosslinking agent need not function in crosslinking.

The solubility of the binder or insolubility of the microgels is determined by actual test. A sample of the solid material is weighed and placed in 100 times by weight of solvent (see particularly the solvents previously listed). The sample is stirred for 15 minutes. Any solid remaining is then removed and dried and finally weighed to determine undissolved solid in comparison to the original sample weight. Because polymeric materials are not absolutely uniform and can contain certain impurities, the material can be considered soluble if up to 10% of the original sample remained undissolved after the test. Conversely the material can be considered to be insoluble if it weighs more than 90% of what it did originally.

Generally the microgel will be present in an amount from 1 to 90 percent by weight of the components of monomer, initiating system, binder and microgel and preferably 5 to 40%. A more limited example of such range is from 8 to 15%.

An example of the suitable concentrations by weight in a photosensitive composition based on these constituents is:
(a) from 5% to 50% of an addition polymerizable ethylenically unsaturated monomer
(b) from 0.01% to 15% of an initiating system activated by actinic radiation
(c) from 0% to 90% of a preferred macromolecular polymer binder and (d) from 1 to 90% by weight of a microgel.

A more limited example of component (a) is from 20% to 35% by weight, of component (b) is from 2% to 10% and of component (c) is 40 to 65%.

Compositions of some of the microgels produced and tested and found useful for the practice of the present invention are detailed in Table I. All parts are by weight.

TABLE I

| MICROGEL | MICROGEL COMPOSITION | | | | | | | | |
|---|---|---|---|---|---|---|---|---|---|
| | MMA | EA | MAA | BMA | EMA | GMA | STY | AMA | BDDA |
| A | 51 | 29 | 20 | — | — | — | — | 0.5 | 2 |
| B | 51 | 29 | 20 | — | — | — | — | — | 2 |
| C | 51 | 29 | 20 | — | — | — | — | — | 0.5 |
| D | 51 | 29 | 20 | — | — | — | — | — | 5 |
| E | 51 | 29 | 20 | — | — | — | — | — | 10 |
| F | 45 | 26 | 29 | — | — | — | — | — | 2 |
| G | 51 | 29 | 20 | — | — | — | — | — | 1.0 |
| H | 51 | 29 | 20 | — | — | — | — | — | 1.5 |
| I | 51 | 29 | 20 | — | — | — | — | — | 0.75 |
| J | 51 | 29 | — | — | — | 20 | — | — | 0.75 |
| K | 43.2 | — | — | 31 | — | — | 20 | 2.9 | 2.9 |
| L | 49.5 | — | — | — | 49.5 | — | — | 0.5 | 0.5 |
| M | 51 | 29 | 20 | — | — | — | — | 0.5 | 0.5 |
| N | 39 | 35 | 26 | — | — | — | — | — | 2 |
| O CORE | 54 | 17 | 14 | — | — | — | — | — | 2 |
| O SHELL | 48 | 26 | 26 | — | — | — | — | — | 2 |
| P CORE | 67 | 22 | 11 | — | — | — | — | — | 2 |
| P SHELL | 21 | 41 | 38 | — | — | — | — | — | 2 |
| Q | 63.2 | — | — | 31 | — | — | — | 2.9 | 2.9 |
| R | 9.8 | 35.3 | 23.5 | — | — | — | 29.4 | — | 1.9 |
| S | 4.9 | 40.2 | 23.5 | — | — | — | 29.4 | — | 1.9 |
| T | 39 | 39 | 20 | — | — | — | — | — | 2.0 |
| U | 48.1 | — | — | — | 48.1 | — | — | 1.9 | 1.9 |

MMA = Methylmethacrylate
EA = Ethyl Acrylate
MMA = Methacrylic Acid
BMA = Butyl Methacrylate
EMA = Ethyl Methacrylate
GMA = Glycidyl Methacrylate
STY = Styrene
AMA = Allyl Methacrylate
BDDA = Butanediol Diacrylate As previously discussed the preferred photosensitive formulation with the microgel will contain a preformed polymeric binder ordinarily present in a concentration of not less than 40% by weight based on the combination of monomer, initiating system, microgel and binder. Suitable binders which can be used alone, if employed, or in combination with one another include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

In the case where aqueous development of the photosensitive composition is desirable the binder should contain sufficient acidic or other groups to render the composition processible in aqueous developer. Useful aqueous-processible binders include those disclosed in U.S. Pat. No. 3,458,311 and in U.S. Pat. No. 4,273,857. Useful amphoteric polymers include interpolymers derived from N-alkylacrylamides or methacrylamides, acidic film-forming comonomer and an alkyl or hydroxyalkyl acrylate such as those disclosed in U.S. Pat. No. 4,293,635. For aqueous development the photosensitive layer will be removed in portions which are not exposed to radiation but will be substantially unaffected during development by a liquid such as wholly aqueous solutions containing 2% sodium carbonate by weight.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4- cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

A class of monomers are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such heteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; $\alpha$-hydrocarbon-substituted aromatic acyloins, including $\alpha$-methylbenzoin, $\alpha$-allylbenzoin and $\alpha$-phenylbenzoin. Photoreducible dyes and reducing agents disclosed in U.S. Pat. Nos.: 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos.: 3,427,161; 3,479,185; and 3,549,367 can be used as initiators. Similarly the cyclohexadienone compounds of U.S. Pat. No. 4,341,860 are useful as initiators. Also useful with photoinitiators and photoinhibitors are sensitizers disclosed in U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Various dyes and pigments may be added to increase the visibility of the resist image. Any colorant used, however, should preferably be transparent to the actinic radiation used.

In use the photosensitive composition for application to a substrate such as in making a printed circuit board, is conventionally supplied by a film which is well known in the art.

A suitable support preferably having a high degree of dimensional stability to temperature changes may be chosen from a wide variety of films composed of high polymers, e.g., polyamides, polyolefins, polyesters, vinyl polymers, and cellulose esters. A preferred support for the present invention is polyethylene terephthalate. Also generally a cover sheet is present in the appropriate side of the photosensitive composition present in film form. The protective cover sheet is removed prior to lamination of the photosensitive composition to a substrate. The cover sheet may be chosen from the same group of polymer films listed as supports. Polyethylene and polyethylene terephthalate are particularly useful.

Although in the above disclosure the photosensitive compositions have been disclosed as containing a polymeric binder, it is understood the suitable compositions which can function for example as photoresists need not contain a binder. In such case the photosensitive composition need only contain (1) an addition polymerizable ethylenically unsaturated monomer, (2) an initiating system activated by actinic radiation and (3) a microgel. Generally the percentage of these components on the basis of these three constituents will be by weight 10% to 60% and preferably 15% to 35% for component (1); 0.01% to 15% and preferably 2% to 10% for component (2) and 25% to 90% and preferably 30% to 65% for component (3). It is understood that in such compositions, a preformed polymer binder will not be present but conventional additives can be added such as those previously mentioned.

A preferred use of compositions characterized herein is as a photoresist or a solder mask such as in making a printed circuit board. Such techniques are conventional in the art employing a solid material, e.g. U.S. Pat. No.

3,469,982. The process is directed to laminating a photosensitive or a substrate comprising:

(a) laminating to the substrate a supported solid photosensitive film,
(b) imagewise exposing the layer to actinic radiation.
(c) removing unexposed areas of the layer to form resist areas,
(d) permanently modifying areas of the substrate which are unprotected by the resist areas by etching the substrate or by depositing a material onto the substrate.

The support is conventionally removed before or after the exposure step. In the case of solder mask utility the step of depositing a material can be by application of solder. In a utility not involving direct use as a solder mask in initial application to a substrate (which is conductive with copper preferred circuitry therein) the resist areas are removed after step (d) which is conventional.

The following examples serve to illustrate, the practice of the present invention. All percentages, ratios and parts are by weight unless otherwise indicated.

EXAMPLE 1

Preparation of Microgel A Table I composition; 51 methylmethacrylate, 29 ethyl acrylate, 20 methacrylic acid, 2 allylmethacrylate and 2 butanedioldiacrylate crosslinker.

The emulsion polymerization apparatus consisted of a 5 liter, 4 necked flask equipped with a mechanical stirrer, 1 liter addition funnel, thermometer, nitrogen inlet, water cooled condenser and a heating mantle. The flask was charged with 3360 g of deionized water and 20 g of a 30% aqueous solution of sodium lauryl sulfonate and this surfactant system was heated to 80° C. under a nitrogen atmosphere. At that temperature, 25% of a monomer mixture consisting of 420 g methylmethacrylate, 240 g ethyl acrylate, 165 g methacrylic acid, 16 g allyl methacrylate and 16 g 1,4-butanediol diacrylate, was added in one shot. This was followed immediately by the addition of 10 ml of a 5% aqueous solution of potassium persulfate and 10 ml of a 7% aqueous solution of potassium phosphate. The reaction mixture turned milky and exothermed to 85° C. The remainder of the monomer mixture was added over a period of 90 minutes while maintaining the temperature between 80°-88° C. When the addition was finished the reaction mixture was heated for an additional 2 hours at 80°-85° C. The bluish milky emulsion was cooled to room temperature and coagulated by adding methanol. The resulting slurry was filtered, washed twice with water, sucked dry and the resulting fine powder was dried in an oven at 100° C. for four hours. The spherical shape of the powder particles was verified by microscopic examination.

EXAMPLE 2

Microgels B to N and Q to U in Table I

Microgels were prepared as in Example 1 except that the monomer mixture was varied to give the the indicated composition.

Core Shell Microgels O and P Table I

Using the apparatus and basic procedure of Example 1, a variation was made in which a first monomer mixture reacts to form a core portion and a second monomer mixture completes the balance of the emulsion polymerization to produce a shell with a different composition. Microgel O was prepared with a first monomer mixture of 315 g methylmethacrylate, 180 g ethyl acrylate, 55 g methacrylic acid and 10.7 g 1,4 butanediol diacrylate, which was added over 50 minutes. Then a second monomer mixture of 105 g methylmethacrylate, 60 g ethyl acrylate, 110 g methacrylic acid and 5.3 g 1,4 butanediol diacrylate was added over 40 minutes.

Microgel P was similarly prepared by altering the monomer mixtures.

EXAMPLE 3

Comparative photoresist coating compositions were prepared as follows:

| Additive | Control | Invention |
|---|---|---|
| Polymer binder methylmethacrylate/ethylacrylate/methacrylic acid 51/29/20 mol. wt. 50,000 acid no. 130 Tg 87° C. | 62.5 | 52.5 |
| Microgel B | — | 10.0 |
| Polyox ® WSRN-3000 polyethylene oxide mol. wt. 400,000 | 0.5 | 0.5 |
| Ethoxylated trimethylolpropane triacrylate monomer | 23.0 | 23.0 |
| Itaconic acid | 1.0 | 1.0 |
| Maleic acid | 1.0 | 1.0 |
| Urethane diacrylate monomer | 4.0 | 4.0 |
| Ethyl paradimethylaminobenzoate | 2.0 | 2.0 |
| Michler's ketone | 0.15 | 0.15 |
| Benzophenone | 5.2 | 5.2 |
| 4-methyl-4-trichloromethyl-cyclohexadienone | 0.1 | 0.1 |
| Leuco crystal violet | 0.3 | 0.3 |
| Diethyl hydroxylamine | 0.2 | 0.2 |
| Victoria green C.I. #42000 | 0.04 | 0.04 |
| Victoria blue C.I. #42575 | 0.04 | 0.04 |

The composition was dissolved for coating in 67% by weight of solvent comprising 93% methylene chloride and 7% methanol. Films of approximately 1.5 mil thickness were produced after coating on a support and drying to remove the solvent.

Film samples were laminated to copper and tested for standard photoresist properties of photospeed, resolution, development in 1% aqueous sodium carbonate and stripping in 1.5% aqueous potassium hydroxide. In addition samples were tested for creep viscosity using the procedures originated by Diens and Klemm published in the *Journal of Applied Physics*, Vol. 17 pages 458 to 471, 1946 on a Du Pont Thermal Mechanical Analyzer attached to a 1090 console. Compared to the control the invention had slightly longer development and stripping stripping times at equivalent resolution but the photospeed was a full $^6\sqrt{2}$ step higher. The control had a creep viscosity of 34 megapoise whereas the incorporation of microgels increased the value to 43 megapoise.

The flexibility and adhesion of the photoresist compositions to copper was tested on both freshly laminated and aged laminated samples. Both the control and the invention were comparable when the copper was bent to varying angles or a crosshatched pattern scratched into the photoresist with a knife was covered with transparent adhesive tape and pulled off. Samples of both films were able to withstand the same amount of bending before showing surface fracture and with the same amount of crosshatching a similar amount of photoresist was removed by the tape.

Both films were tested for tenting, i.e., the ability of a film to maintain its integrity when coated over a void. Cleaned copper-clad panels had 100 holes each of the following diameters drilled: 6 mm, 4 mm and 3 mm. A photoresist film was then laminated over these holes using a Riston® model HRL-24 hot roll laminator at 105° C.. The laminated panel was irradiated coventionally with a high pressure mercury vapor lamp to photopolymerize the layer over the holes. The coversheet was removed and the film was developed by lightly spraying with a 1% aqueous sodium carbonate solution and the number of broken tents was measured. The panels were then run through an acid etch and with approximately 1N HCl at pressures of 30/28 psi and broken tents were again measured. The results showed a general improvement in ability to tent as the concentration of microgel increased.

A further photoresist coating composition was prepared with the same combination of components as the "Invention" except the ethoxylated trimethylolpropane triacrylate monomer was 24.5 (rather than 23.0), the itaconic acid was 0.5 (rather than 1.0), maleic acid was 0 (rather than 1.0) and Victoria blue was 0.02 (rather than 0.04). Improved results were obtained over the control and the composition labelled "Invention".

EXAMPLE 4

Photoresist compositions were prepared as in Example 3 except that different levels of binder replacement were used up to and including total replacement of soluble binder by insoluble microgel. The relative properties of the control and microgel films are shown below.

| Variation of Microgel Content | | | | | | | |
|---|---|---|---|---|---|---|---|
| % Microgel as film solids | 0 | 10 | 12.4 | 15.6 | 19 | 31.2 | 62.5 |
| % Microgel as binder replacement | 0 | 16 | 20 | 25 | 30 | 50 | 100 |
| Dev. Rate | 875 | 805 | 788 | 735 | 709 | 551 | 116 |
| Photospeed | 22 | 23 | 24 | 24 | 24–25 | 23–24 | 23 |
| Resolution | good | good | good | good | poor | poor | very poor |
| Time to strip | 28 | 35 | 35 | 36 | 38 | 45 | 75 |
| Flex/adhesion | = | = | = | = | = | = | poorer |
| Creep viscosity | 34 | 43 | 58 | 53 | 63 | 163 | 542 |

Development Rate is milligrams per minute removed on a sample which was 9 square inches
Photospeed was $\sqrt[6]{2}$ steps held on a Stauffer 41 step wedge
Time to strip is in seconds
Creep viscosity is megapoise
= is similar While the film containing only microgel as a binder shows severe degradation in resolution and flexibility/adhesion, it still can function as a film suitable for making printed wiring boards and would be employed most advantageously where high creep viscosity was an important factor.

It is also apparent from the data presented that when only 25% or less of the binder has been replaced by microgel there is a speed and creep viscosity advantage as a tradeoff for decreased development and stripping, but without any sacrifice in important properties such as resolution and flexibility/adhesion.

EXAMPLE 5

Photoresist compositions were prepared as in Example 3 except that the microgel particles used to replace 10% of the binder had varying levels of crosslinking. The results below compare the effects of 2%, 5% and 10% crosslinking of the microgels and a control film without microgel addition. Percent crosslinking denotes parts crosslinking monomer added during synthesis. The films prepared were 1.3 mil instead of 1.5 mil in Example 1 in order to provide a more severe test of tenting capability.

| | Microgel Crosslinking | | | |
|---|---|---|---|---|
| | Control | 2% | 5% | 10% |
| Dev. Rate | 814 | 781 | 790 | 838 |
| Photospeed | 22 | 23–24 | 23–24 | 23 |
| Time to strip | 24 | 28 | 30 | 34 |
| Creep viscosity | 52 | 61 | 63 | 112 |
| Tenting (6 mm holes unbroken) | 2% | 7% | 9% | 15% |

Units are as previously specified

These tests with 1.3 mil films show the consistent improvement in tenting, creep viscosity and photospeed for microgel incorporation.

EXAMPLE 6

A control and a coating containing 10% microgels were prepared as in Example 3 but no solvent was added. Instead the compositions were melt-extruded onto a support to examine relative properties in the absence of any organic solvent. When samples were laminated to copper and given chemical and physical tests it was determined that with the exception of longer strip times for both the control and the invention, the incorporation of microgels produced an advantage of photospeed and creep viscosity as a tradeoff lower higher development rate and longer time to strip. When samples were tested with 1.3 mil films as in Example 3 a significant advantage in tenting was observed for the invention versus the control. Thus it can be concluded that the microgel advantage is independent of coating method used for film preparation.

EXAMPLE 7

Photopolymer compositions were prepared similar to Example 3 except that different microgels were used. Table I contains a summary of the microgel compositions incorporated in these compositions to produce photoresist films. It was observed that microgels containing acid groups were easier to incorporate into these coating compositions, i.e., requiring shorter dispersion times.

EXAMPLE 8

Several photopolymer compositions were prepared as in Example 3 except that different primary binders and monomers were employed with the microgels. Binders used were: polymer of methylmethacrylate/ethylacrylate/acrylic acid/cyclohexylmethacrylate 15/40/25/20; amphoteric interpolymer from 40% n-tertoctyl acrylamide, 34% methylmethacrylate, 10% acrylic acid, 6% hydroxy propyl methacrylate and 4% t-butyl amino ethyl methacrylate; polymer of styrene butyl maleate; polymer of methyl methacrylate/2-ethylhexyl acrylate-methacrylic acid 65/31/2 and polymer of styrene methacrylic acid. Other monomers used were trimethylolpropane triacrylate and pentaerythritol triacrylate. Film samples were prepared similar to example in which the thicknesses varied from 1.29 to 1.79 mil due to viscosity differences. Improved creep viscosity and photospeed was observed when microgels were incorporated compared to a control with no microgels.

EXAMPLE 9

Microgels B and J from Table I were dispersed into the polymer binder of Example 3 using a 2-roll mill. Two 100 g portions of 50/50 microgel/polymer were each mixed with 100 ml of methylene chloride/methanol 93/7 and allowed to stand for about 1 hour. The two roll mill was cleaned with 3:1 binder/triethyleneglycoldiacetate. The material was milled for 10 minutes at 175° C. Mixing and melt looked good and the material was cut off and reintroduced several times during the run. At the end of 10 minutes the melted mixture was cut off the mill and allowed to cool. Prior to use in a photopolymer composition the material was hand ground. Films prepared with the milled materials showed the same creep viscosity advantage as compositions prepared by stirring.

EXAMPLE 10

Film samples with the composition of Example 3 containing microgels prepared as in Example 1 and melt extruded as in Example 6 were tested for printed circuit board manufacture. The films were laminated to a copper clad board and exposed on a PC24 Riston ® exposure device through a circuit board test pattern. The film cover sheet was removed and the exposed boards were processed in a Riston ® Aqueous Development System ADS-24 with 1% aqueous Na₂CO₃ at 30° C. at a conveyor setting of 150 using a top spray pressure of 30 psi and bottom of 29 psi. The samples were etched to remove copper in the nonresist areas and then the resist was removed by stripping with 1.5% aqueous potassium hydroxide. A detailed examination of the resulting printed circuit boards showed equivalent quality to boards similarly prepared with commercial photoresist films.

EXAMPLE 11

The comparative solubility of the binder and insolubility of the microgels was determined by actual test. A 1 gram sample in 100 ml of 2% aqueous sodium carbonate was stirred at 29° C. for 10 minutes. The sample was centrifuged for 40-45 minutes and the supernatant decanted. The remaining solid was washed with a minimum amount of water, centrifuged, dried and weighed. The supernatant was also dried and weighed. The following is an experimental comparison of the polymer binder of Example 1 and microgels C and G of Table I.

| Sample | Solid Remaining Grams |
| --- | --- |
| Polymer binder | 0.0150 |
| Microgel C | 0.9736 |
| Microgel G | 0.9674 |

EXAMPLE 12

The comparative swellability of the microgel B and the prior art polytrimethylolpropanetriacrylate beads of Example 1 of U.S. Pat. No. 4,414,278 was determined by actual test. The viscosity of a test solution of 8% by weight methanol and 92% by weight methylene chloride was determined to be 2.5 centipoise using a Brookfield viscometer with a No. 2 spindle. 10 g solid material of microgel B and polytrimethylolpropane triacrylate were introduced into separate 100 g test solutions and stirred for 24 hours. The weight was brought up to 110 g at the end of this time period to correct for any evaporation. Using the same Brookfield viscometer with a No. 2 spindle the viscosity of microgel B solution was 3800 centipoise while the solution of polytrimethylolpropane triacrylate beads was 5.0 centipoise. In appearance at the end of the 24 hour period microgel B in the test solution was invisible, having assumed the same refractive index as the test solution (apparently by swelling) while the comparative test beads in the test solution had an identical milky appearance observed at the time of their initial introduction in the test solution.

What is claimed is:

1. A photosensitive composition comprising
    (a) addition polymerizable ethylenically unsaturated monomer,
    (b) initiating system activated by actinic radiation,
    (c) preformed macromolecular polymer binder, and
    (d) microgel which swells at least 10% by volume in a solvent selected from the group consisting of n-heptane, carbon tetrachloride, toluene, methylene chloride, ethyl acetate, acetone, acetonitrile, acetic acid, dimethylsulfonxide, dimethylformamide, formamide, water, aqueous ammonium hydroxide solution containing up to 10% by weight ammonia, aqueous potassium hydroxide solution containing up to 10% by weight potassium hydroxide, methylene chloride-methanol solution containing by weight 92% methylene chloride and 8% methanol, and aqueous sodium carbonate solution containing by weight 1% sodium carbonate,
wherein the photosensitive composition is a solid and wherein at least one of the following is present:
    (i) the polymer binder and microgel form substantially one phase as viewed by the naked eye, or
    (ii) the polymer binder and microgel have glass transition temperatures which do not differ by more than 50° C. with the microgel having a glass transition temperature above 25° C.

2. The composition of claim 1 wherein properties (i) and (ii) are present.

3. The composition of claim 1 wherein the substantially one phase is present and observable after a magnification of 10 times.

4. The composition of claim 2 wherein the substantially one phase is present and observable after a magnification of 100 times.

5. The composition of claim 1 wherein the glass transition temperature of the polymer binder and the microgel do not differ by more than 25° C.

6. The composition of claim 1 wherein the microgel swells at least 50% in at least one of the solvents.

7. The composition of claim 1 which has a creep viscosity of at least 20 megapoise.

8. The composition of claim 7 which has a creep viscosity of at least 40 megapoise.

9. An article comprising a storage stable photosensitive composition supported by a flexible film with the article wound in a roll whereby the photosensitive composition comprises
    (a) addition polymerizable ethylenically unsaturated monomer,
    (b) initiating system activated by actinic radiation,
    (c) preformed macromolecular polymer binder, and
    (d) microgel which swells at least 10% by volume in a solvent selected from the group consisting of n-heptane, carbon tetrachloride, toluene, methylene chloride, ethyl acetate, acetone, acetonitrile, acetic acid, dimethylsulfoxide, dimethylformamide, formamide, water, aqueous ammonium hydroxide solution containing up to 10% by weight ammonia, aqueous potassium hydroxide, methylene chloride-methanol solution containing by weight 92% methylene chloride and 8% methanol, and aqueous sodium carbonate solution containing by weight 1% sodium carbonate,
wherein the photosensitive composition is a solid and wherein at least one of the following is present:
(i) the polymer binder and microgel form substantially one phase as viewed by the naked eye, or
(ii) the polymer binder and microgel have glass transition temperatures which do not differ by more than 50° C. with the microgel having a glass transition temperature above 25° C.

10. The article of claim 9 wherein properties (i) and (ii) are present.

11. The article of claim 9 wherein the substantially one phase is present and observable after a magnification of 10 times.

12. The article of claim 11 wherein the substantially one phase is present and observable after a magnification of 100 times.

13. The article of claim 9 wherein the glass transition temperature of the polymer binder and the microgel do not differ by more than 25° C.

14. The article of claim 1 wherein the microgel swells at least 50% in at least one of the solvents.

15. The article of claim 9 which has a creep viscosity of at least 20 megapoise.

16. The article of claim 15 which has a creep viscosity of at least 40 megapoise.

* * * * *